(12) United States Patent
Chen et al.

(10) Patent No.: US 10,134,449 B2
(45) Date of Patent: Nov. 20, 2018

(54) SEMICONDUCTOR MEMORY DEVICE

(71) Applicant: UNITED MICROELECTRONICS CORP., Hsin-Chu (TW)

(72) Inventors: Chien-Hung Chen, Taipei (TW); Meng-Ping Chuang, Hsinchu (TW); Tong-Yu Chen, Hsinchu (TW); Yu-Tse Kuo, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 82 days.

(21) Appl. No.: 15/589,985

(22) Filed: May 8, 2017

(65) Prior Publication Data
US 2018/0286474 A1    Oct. 4, 2018

(30) Foreign Application Priority Data
Mar. 28, 2017   (TW) ............................. 106110280 A (51) Int. Cl.
  *G11C 5/02*    (2006.01)
  *G11C 11/412*  (2006.01)
  *H01L 27/11*   (2006.01)

(52) U.S. Cl.
  CPC ............ *G11C 5/025* (2013.01); *G11C 11/412* (2013.01); *H01L 27/11* (2013.01); *H01L 27/1104* (2013.01)

(58) Field of Classification Search
  CPC ......... G11C 5/02; G11C 5/025; G11C 11/412; H01L 27/11; H01L 27/1104
  See application file for complete search history.

(56) References Cited

U.S. PATENT DOCUMENTS

| | | | |
|---|---|---|---|
| 5,930,163 A | 7/1999 | Hara | |
| 6,118,158 A | 9/2000 | Kim | |
| 6,147,385 A | 11/2000 | Kim | |
| 2005/0078546 A1* | 4/2005 | Hirano | H01L 21/84 365/232 |

* cited by examiner

*Primary Examiner* — Harry W Byrne
*Assistant Examiner* — R Lance Reidlinger
(74) *Attorney, Agent, or Firm* — Winston Hsu (57) ABSTRACT

A semiconductor memory device including a memory cell having a plurality of memory cells, a first P-type well region, a second P-type well region, and an N-type well region disposed between the first P-Type well region and the second P-type well region. The semiconductor memory element defines a plurality of first regions and a plurality of second regions, each of the first regions and each of the second regions including one of the memory cells, each of the second regions further includes at least two first voltage providing contacts, and at least one second voltage providing contact, wherein the first voltage providing contacts and the second voltage providing contact are not located within each first region.

16 Claims, 10 Drawing Sheets

SEMICONDUCTOR MEMORY DEVICE

BACKGROUND OF THE INVENTION

1. Field of the Invention

The invention relates to a semiconductor memory device, and more particularly, to a semiconductor memory device with static random access memory (SRAM).

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

SUMMARY OF THE INVENTION

The present invention provides a semiconductor memory device, the semiconductor memory device comprises a first P-type well region, extending along a first direction, a second P-type well region, extending along the first direction, an N-type well region, extending along the first direction, and disposed between the first P-type well region and the second P-type well region.

With respect to a plan view of a principal plane of the semiconductor memory device, the following conditions are satisfied:

(1) the semiconductor memory device defines a plurality of first regions, each first region being arranged along the first direction;

(2) the semiconductor memory device defines at least one second region, the second region disposed between two adjacent first regions, the second region and each first region not being overlapped with each other; (3) each second region further comprises at least two first voltage providing contacts, providing a first voltage to the first P-type well region and the second P-type well region, and a second voltage providing contact, providing a second voltage to the N-type well region, wherein the first voltage providing contacts and the second voltage providing contact are not located within each first region; and (4) each first region and each second region comprise a memory cell disposed therein, each memory cell comprises a plurality of N-channel MOS (NMOS) transistors and a plurality of P-channel MOS (PMOS) transistors, each PMOS transistor being disposed within the N-type well region, and each NMOS transistor being disposed within the first P-type well region or the second P-type well region.

The feature of the present invention is having long stripes-shaped P-type well regions and N-type well regions, and all memory cells being disposed within and arranged along the P-type well regions or the N-type well regions, the manufacturing processes can be simplified. In addition, each memory cell in the first region responsible for the main data storage function, and the needed voltages contacts of the memory cells (including the Vcc, Vss, or the voltages providing to the P-type well regions and N-type well regions) are not disposed within the first region, but only disposed within the second region or the third region, so the area of each first region can be reduced. Furthermore, since the second regions and the third regions also include the memory cell, so if necessary, the second region and the third region may also be used as spare storage data elements.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
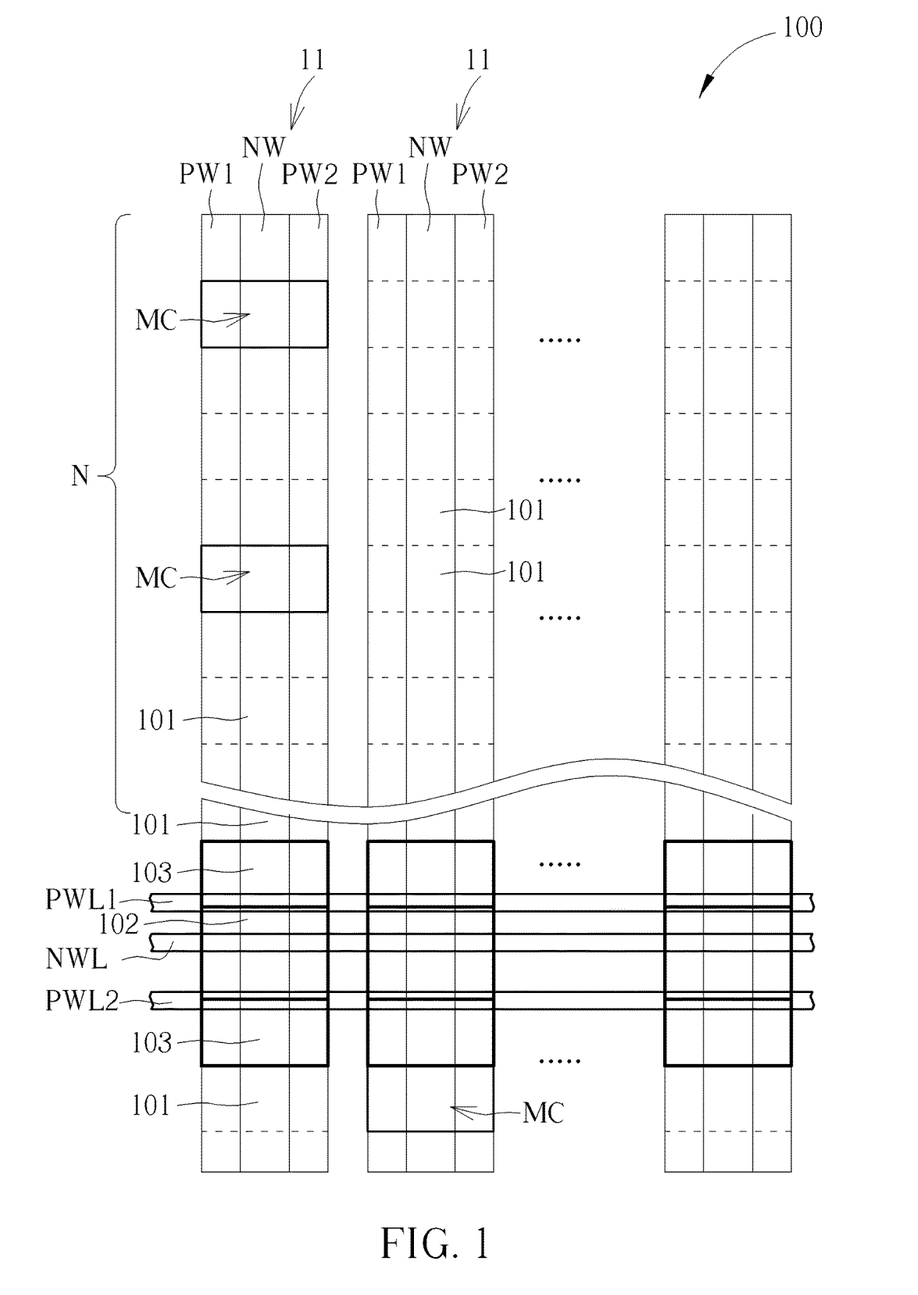
FIG. 1 illustrates a partial top view diagram of the semiconductor memory device according to a first preferred embodiment of the present invention.

Please refer to FIG. 1. FIG. 1 illustrates a partial top view diagram of the semiconductor memory device according to a first preferred embodiment of the present invention. As shown in FIG. 1, a semiconductor memory device 100 includes a plurality of memory arrays 11 parallel to each other, each memory array 11 including a plurality of memory cells MC (to simplify the figure, only parts of the memory cells MC are labeled in FIG. 1), and each memory cell MC being arranged along a first direction (such as Y-direction). The memory cell MC such as a static random access memory (SRAM), more precisely, such as a six-transistor static random access memory (6T-SRAM) or an eight-transistor static random access memory (8T-SRAM), but not limited thereto. In order to simplify the figure, the inner structure of each SRAM is omitted, and not shown in FIG. 1. The structure of the SRAM will be described more detail in the following paragraphs.

In the substrate under each memory array, a first P-type well region PW1, a second P-type well region PW2 and an N-type well region NW are formed. The first P-type well region PW1, the second P-type well region PW2 and the N-type well region NW being arranged along the first direction, and the N-type well region NW being disposed between the first P-type well region PW1 and the second P-type well region PW2. In the present invention, each memory cell MC includes a plurality of N-channel MOS transistors (NMOS transistors) and a plurality of P-channel MOS transistors (PMOS transistors) (not shown in FIG. 1), each PMOS transistor being disposed within the N-type well region NW, and each NMOS transistor being disposed within the first P-type well region PW1 or the second P-type well region PW2. When viewed in the top view, the first P-type well region PW1, the second P-type well regions PW2 and the N-type well region NW are long stripes-shaped and arranged along the first direction, so the manufacturing process can be simplified. Furthermore, all memory cells MC are also arranged along the first direction, so the memory cells MC of one memory array 11 share the first P-type well region PW1, the second P-type well region PW2, and the N-type well region NW, and the structure is simple.

When viewed in the top view, each memory array 11 of the semiconductor memory device 100 defines a plurality of first regions 101, a plurality of second regions 102 and a plurality of third regions 103, the first regions 101, the second regions 102 and the third region 103 are not overlapped with each other. Each first region 101, each second region 102 and each third region 103 comprise one memory cell MC disposed therein. The first regions 101 are adjacent to each other. Preferably, specific numbers of the first regions 101, such as $2^n$ (n being an integer greater than 1) first region 101 compose a memory group, and each memory array 11 may include a plurality of memory groups (such as M memory groups, and each memory group has $2^n$ first regions 101). The second region 102 and the third regions 103 being disposed between two memory groups consist of first regions 101. More precisely, $2^n$ first region 101 totally includes $2^n$ memory cells MC, each memory cell MC storing data respectively, and the second region 102 and the third regions 103 being disposed between the memory groups, they can be deemed as the edge region of two memory groups. Therefore, to one memory array 11, the first region 101, the second region 102 and the third region 103 are arranged according to the following rule: $2^n$ first regions 101, the third region 103, the second region 102, the third region 103, $2^n$ first regions 101 . . . and repeat the above order.

Besides, two first voltage providing lines PWL1, PWL2, and one second voltage providing line NWL pass through the second region 102, and are arranged along a second direction (such as X-direction). The two first voltage providing lines PWL1, PWL2 provide a first voltage to the first P-type well region PW1 and the second P-type well region PW2 respectively, so as to make the first P-type well region PW1 and the second P-type well region PW2 have a bias. Similarly, the second voltage providing line NWL provides a second voltage to the N-type well region NW, and makes the N-type well region NW have a specific bias. The purpose for providing the bias is to adjust the threshold voltage (Vt) or to reduce the tunneling effect. In addition, the arrangement of the first voltage providing lines PWL1, PWL2 and the second voltage providing line NWL of the present invention is not limited to FIG. 1, and they can be adjusted according to actual requirements. But it is noteworthy that when viewed in the top view, the first voltage providing lines PWL1, PWL2 and the second voltage providing line NWL are not overlapped with each first region 101.

Furthermore, other metal lines may pass through the second region 102, such as the metal line for providing the voltage Vcc or Vss (or grounded line) to the memory cell MC, word lines or bit lines. To simplify the description, these metal lines are omitted, but it can be understood that the metal lines belong to the elements of the semiconductor memory device.

Figure 2:
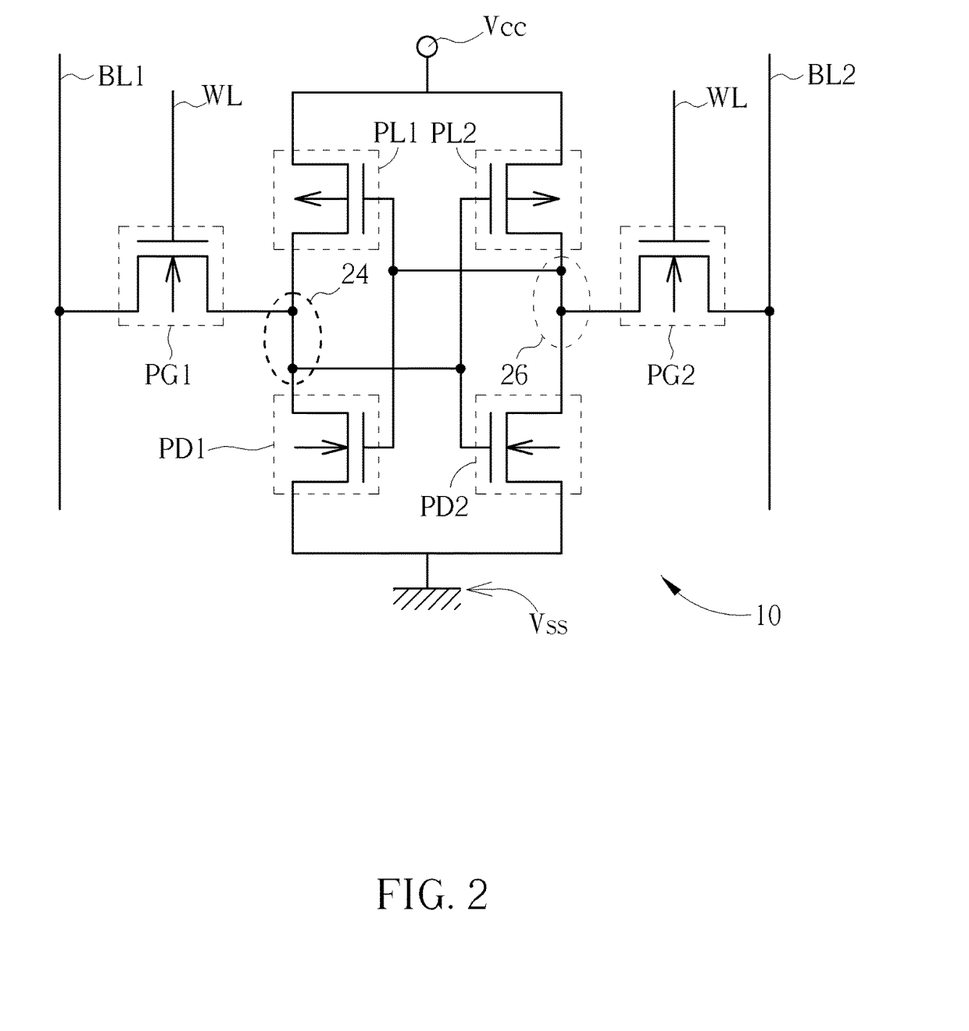
FIG. 2 illustrates a circuit diagram of a six-transistor SRAM (6T-SRAM) cell according to a first preferred embodiment of the present invention.

The memory cell MC of the present invention preferably comprises a six-transistor SRAM (6T-SRAM) 10. It is noteworthy that in other embodiments of the present invention, the memory cell MC is not limited to 6T-SRAM, it can also include such as 8T-SRAM or other suitable memory elements. The following paragraphs take the 6T-SRAM as an example. Please refer to FIG. 2. FIG. 2 illustrates a circuit diagram of a six-transistor SRAM (6T-SRAM) cell according to a first preferred embodiment of the present invention.

In this embodiment, each 6T-SRAM cell 10 is composed of a first pull-up device PL1, a second pull-up device PL2, and a first pull-down device PD1, a second pull-down device PD2, a first pass gate device PG1 and a second pass gate device PG2. These six devices (transistors) constitute a set of flip-flops. The first and the second pull-up devices PL1 and PL2, and the first and the second pull-down devices PD1 and PD2 constitute a latch circuit 22 that stores data in the storage nodes 24 and 26. Since the first and the second pull-up devices PL1 and PL2 act as power load devices, they can be replaced by resistors. Under this circumstance, the static random access memory becomes a four-transistor SRAM (4T-SRAM). In this embodiment, the first and the second pull-up devices PL1 and PL2 preferably share a source/drain region and electrically connect to a voltage source (voltage node) Vcc, and the first and the second pull-down devices PD1 and PD2 share a source/drain region and electrically connect to a voltage source (voltage node) Vss.

Preferably, the first and the second pull-up devices PL1 and PL2 of the 6T-SRAM cell 10 are composed of p-type metal oxide semiconductor (PMOS) transistors; the first and the second pull-down devices PD1 and PD2, the first pass gate devices PG1 and the second pass gate devices PG2 are composed of n-type metal oxide semiconductor (NMOS) transistors, but not limited thereto. The first pull-up device PL1 and the first pull-down device PD1 constitute an inverter, which further form a series circuit 28. One end of the series circuit 28 is connected to a voltage source Vcc and the other end of the series circuit 28 is connected to a voltage source Vss. Similarly, the second pull-up device PL2 and the second pull-down device PD2 constitute another inverter and a series circuit 30. One end of the series circuit 30 is connected to the voltage source Vcc and the other end of the series circuit 30 is connected to the voltage source Vss. The two inverters are cross-coupled to each other to store data.

The storage node 24 is connected to the respective gates of the second pull-down device PD2 and the second pull-up device PL2. The storage node 24 is also connected to the drains of the first pull-down device PD1, the first pull-up device PL1 and the first pass gate device PG1. Similarly, the storage node 26 is connected to the respective gates of the first pull-down device PD1 and the first pull-up device PL1. The storage node 26 is also connected to the drains of the second pull-down device PD2, the second pull-up device PL2 and the second pass gate device PG2. The gates of the first pass gate device PG1 and the second pass gate device PG2 are respectively coupled to a word line (WL); the source of the first pass gate device PG1 and the second pass gate device PG2 are respectively coupled to a first bit line (BL1) and a second bit line (BL2).

Figure 3:
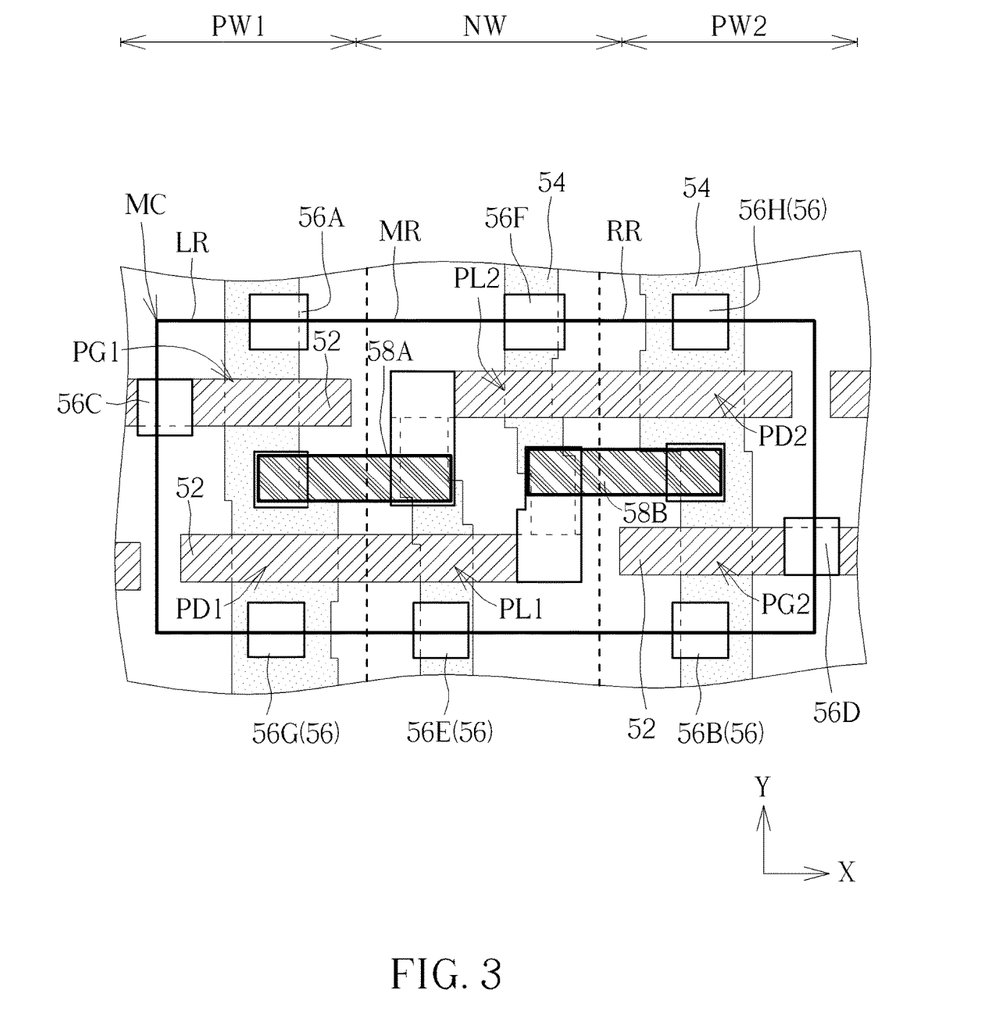
FIG. 3 illustrates a layout diagram of a memory cell (MC) within the first region 101 according to a first preferred embodiment of the present invention.

Please refer to FIG. 3, which illustrates a layout diagram of a memory cell (MC) within the first region 101 according to a first preferred embodiment of the present invention. As mentioned above, each first region 101, each second region 102 and each third region 103 have a memory cell MC disposed therein. Taking memory cell MC in the first region 101 as an example, the memory cells MC in the second region 102 or in the third region 103 have the similar structure to the memory cell MC mentioned here. The memory cell MC has a plurality of gate lines 52 and a plurality of diffusion regions 54 crossed to each other, the extending direction of the gate line 52 is substantially perpendicular to the extending direction of each diffusion region 54. The crossed portion of the gate lines 52 and each diffusion region 54 compose a plurality of transistors (i.e. the first pull-up transistor PL1, the second pull-up transistor PL2, the first pull-down transistor PD1, the second pull-down transistor PD2, the first access transistor PG1, and the second access transistor PG2 mentioned in FIG. 2, and labeled in FIG. 3).

It is noteworthy that in the region of one memory cell MC, a left region LR, a right region RR and a middle region MR are defined, the middle region MR is disposed between the left region LR and the right region RR. The left region LR overlaps with the first P-type well region PW1, the right region RR overlaps with the second P-type well region PW2, and the middle region MR overlaps with the N-type well region NW. All PMOS transistors of the memory cell MC (including the first pull-up transistor PL1 and the second pull-up transistor PL2) are disposed within the middle region MR, and all NMOS transistors (including the first pull-down transistor PD1, the second pull-down transistor PD2, the first access transistor PG1, and the second access transistor PG2) of the memory cell MC are disposed within the left region LR or the right region RR.

Besides, the memory cell MC further comprises a plurality of contact structures 56, including contact structures 56A, 56B, 56C, 56D, 56E, 56F, 56G, and 56H, used to electrically connect different elements. For example, the contact structure 56A is electrically connected to the first access transistor PG1 and the first bit line BL1; the contact structure 56B is electrically connected to the second access transistor PG2 and the second bit line BL2; the contact structure 56C is electrically connected to one of the word line WL and the gate of the first access transistor PG1; the contact structure 56D is electrically connected to one of the word line and the gate of the second access transistor PG2; the contact structure 56E is electrically connected to the first pull-up transistor PL1 and the voltage source Vcc; the contact structure 56F is electrically connected to the second pull-up transistor PL2 and the voltage source Vcc; the contact structure 56G is electrically connected to the first pull-down transistor PD1 and the voltage source Vss (or grounded); the contact structure 56H is electrically connected to the first pull-down transistor PD1 and the voltage source Vss (or grounded), and other contact structures not mentioned here are labeled as contact structures 56.

In addition, the SRAM further comprises a first metal layer 58A and a first metal layer 58B. The first metal layer 58A corresponds to the storage node 24 shown in FIG. 2, which is electrically connected to the gate of the second pull-down transistor PD2 and the gate of the second pull-up transistor PL2, and the drain of the first pull-down transistor PD1, the drain of the first pull-up transistor PL1 and the drain of the first access transistor PG1. On the other hand, the first metal layer 58B corresponds to the storage node 26 shown in FIG. 2, which is electrically connected to the gate of the first pull-down transistor PD1 and the gate of the first pull-up transistor PL1, and the drain of the second pull-down transistor PD2, the drain of the second pull-up transistor PL2 and the drain of the second access transistor PG2.

Figure 4:
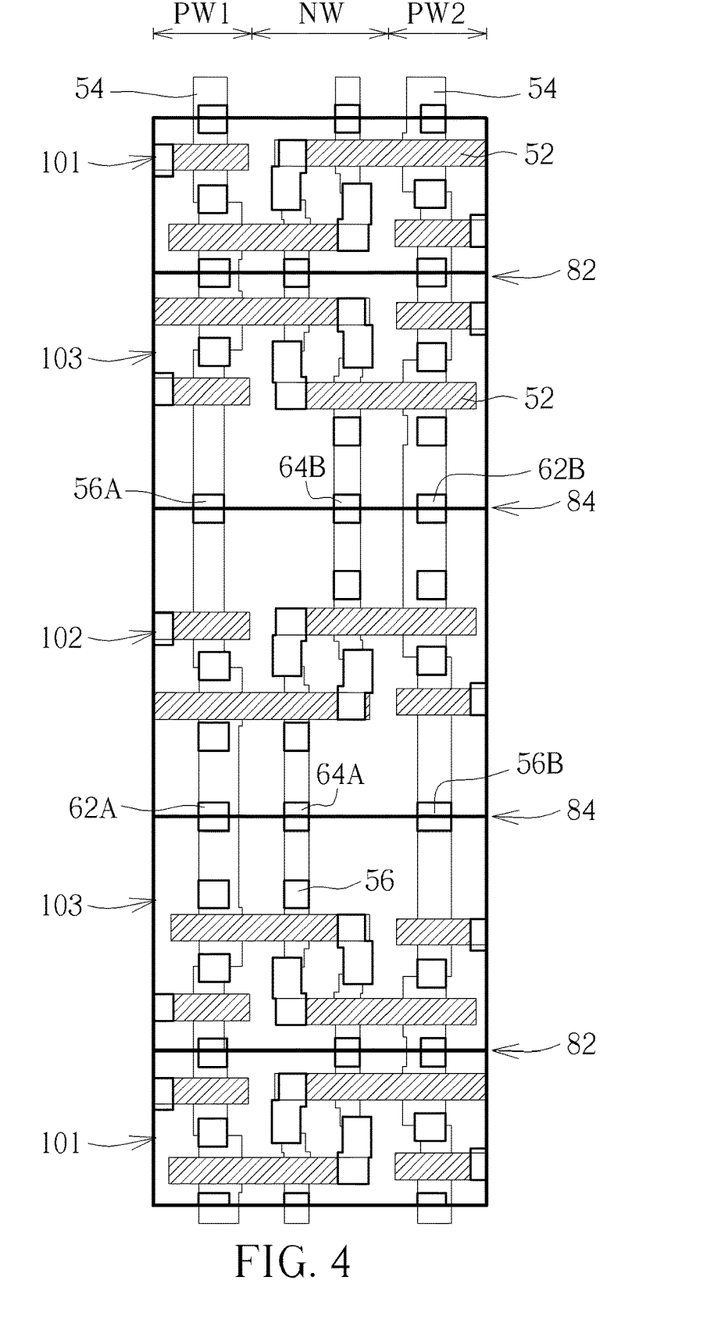
FIGS. 4-7 illustrate the layout diagrams of partial first region, partial second region and partial third region of the present invention.

Next, please refer to FIG. 4, which illustrates the schematic diagram of a partial first region 101, a partial second region 102 and a partial third region 103 of the present invention. It should be noted that in FIG. 4, only the gate lines 52, the diffusion regions 54 and the contact structures 56 are shown, and other elements such as the first metal layer are temporarily omitted. Both the second region 102 and the third region 103 also comprise the memory cell MC (such as 6T-SRAM) disposed therein. Besides the memory cell MC, the second region 102 further comprises two first voltage providing contacts 62A, 62B, and two second voltage providing contacts 64A, 64B. The two first voltage providing contacts 62A, 62B are electrically connected to the first voltage providing lines PWL1, PWL2 respectively, and two second voltage providing contacts 64A, 64B are electrically connected to the second voltage providing line NWL. Besides, in the present invention, the boundary line (the interface) between the first region 101 and the third region 103 is defined as a first boundary line 82, and the boundary line (the interface) between the second region 102 and the third region 103 is defined as a second boundary line 84. The first voltage providing contacts 62A, 62B and the second voltage providing contacts 64A, 64B are overlapped with the second boundary line 84, but not overlapped with the first boundary line 82. In other words, the first voltage providing contacts 62A, 62B and the second voltage providing contacts 64A, 64B are partially disposed within the second region 102 and the third region 103, but not disposed within the first region 101.

The first voltage providing contacts 62A, 62B are respectively electrically connected to the first voltage providing lines PWL1, PWL2 shown in FIG. 1, and the second voltage providing contacts 64A, 64B are electrically connected to the second voltage providing line NWL, used for providing voltages to the first P-type well region PW1, the second P-type well region PW2 and the N-type well region NW. It is noteworthy that there are not any contact structures used for providing the first voltage to the first P-type well region PW1 and the second P-type well region PW2 disposed within the first region 101, or any contact structures used for providing the second voltage to the N-type well region NW disposed within the first region 101. In other words, all needed voltages of the first P-type well region PW1, the second P-type well region PW2 and the N-type well region NW in the first region 101, are provided by the first voltage providing lines PWL1, PWL2 and the second voltage providing line NWL. Therefore, since the first voltage providing lines PWL1, PWL2 and the second voltage providing line NWL are not disposed in the first region 101, the area of each first region 101 can be decreased.

Figure 5:
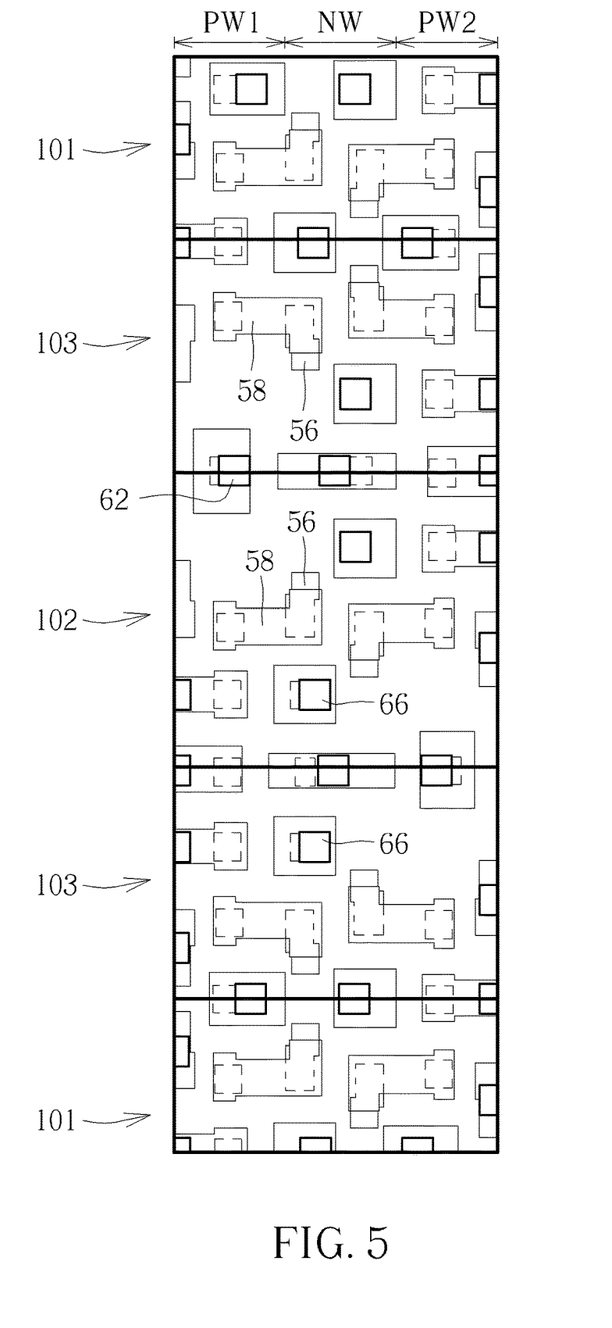

Afterwards, please refer to FIGS. 5-7, which show the schematic diagrams after some metal layers and some contact structure are formed in the following processes according to FIG. 4. As shown in FIG. 5, to simplify the figure, FIG. 5 only keeps the contact structures 56 shown in FIG. 4, and the rest of the elements (such as the gate lines and the diffusion regions) are omitted. As shown in FIG. 5, a first metal layer 58 is formed, which is electrically connected to each contact structure 56, and a plurality of first via structures 66 are formed on parts of the first metal layer 58.

Figure 6:
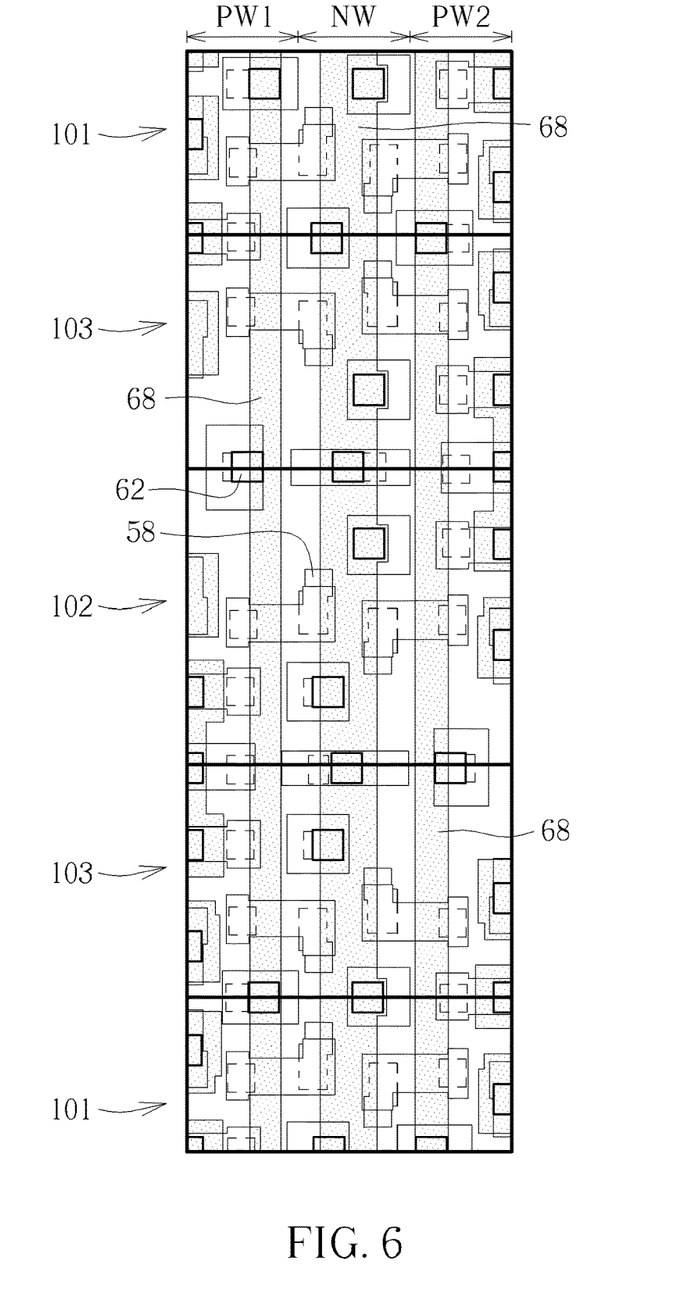
Figure 7:
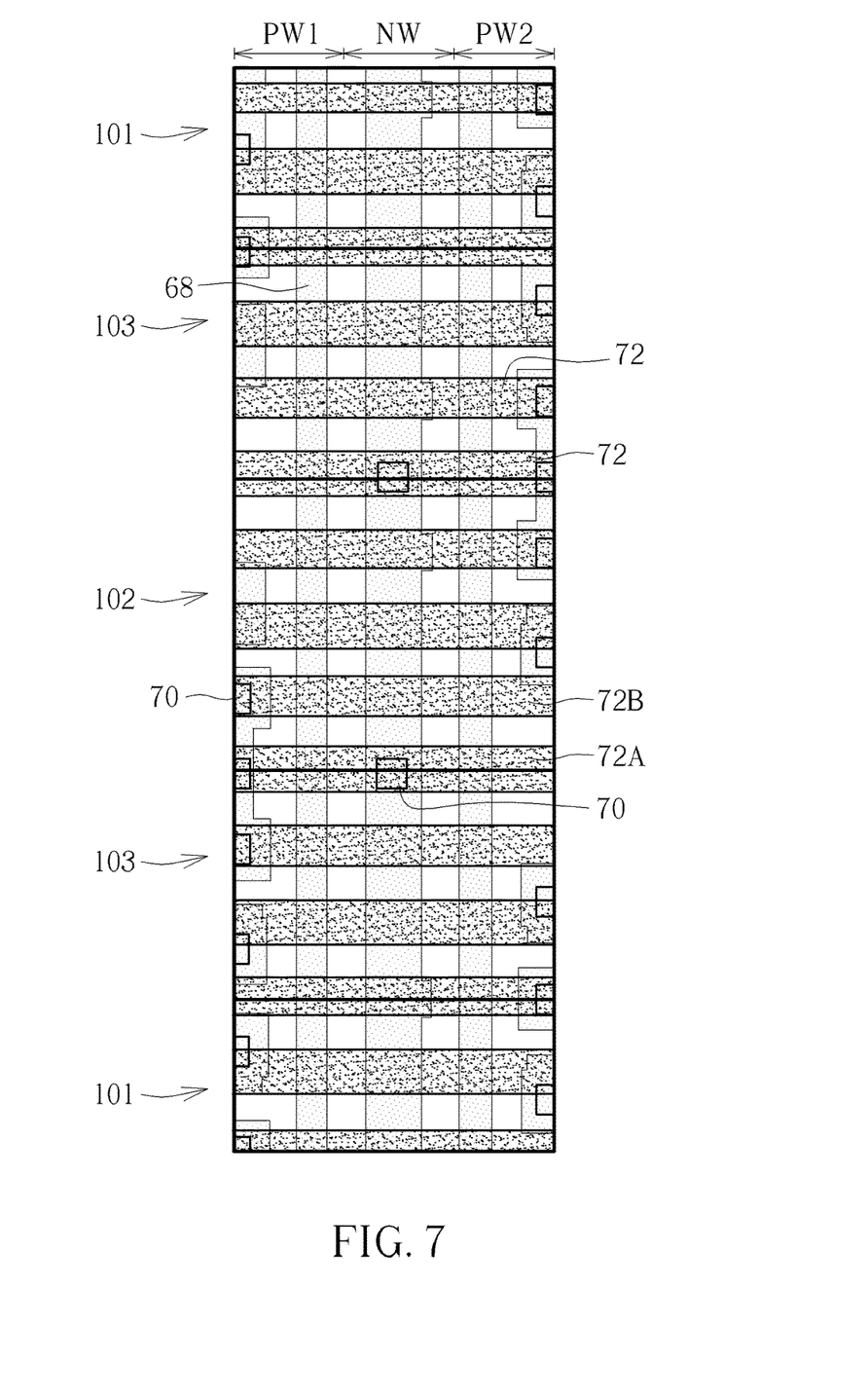

As shown in FIG. 6, a plurality of second metal layers 68 are then formed, to electrically connect to each via structure 66. As shown in FIG. 7, a plurality of second via structures 70 are formed, to electrically connect to each second metal layer 68, and a plurality of third metal layers 72, 72A, 72B are formed. In some embodiments, some elements are electrically connected to each other, such as the first voltage providing contacts 62A, 62B that can electrically connected to the voltage source Vss or grounded (such as the third metal layer 72B shown in FIG. 7), or the second voltage providing contacts 64A, 64B and the voltage source Vcc that can be connected to each other (such as the third metal layer 72A shown in FIG. 7). Therefore, the pattern density of the third metal layer 72 can be decreased, and thereby improving the yield.

Figure 8:
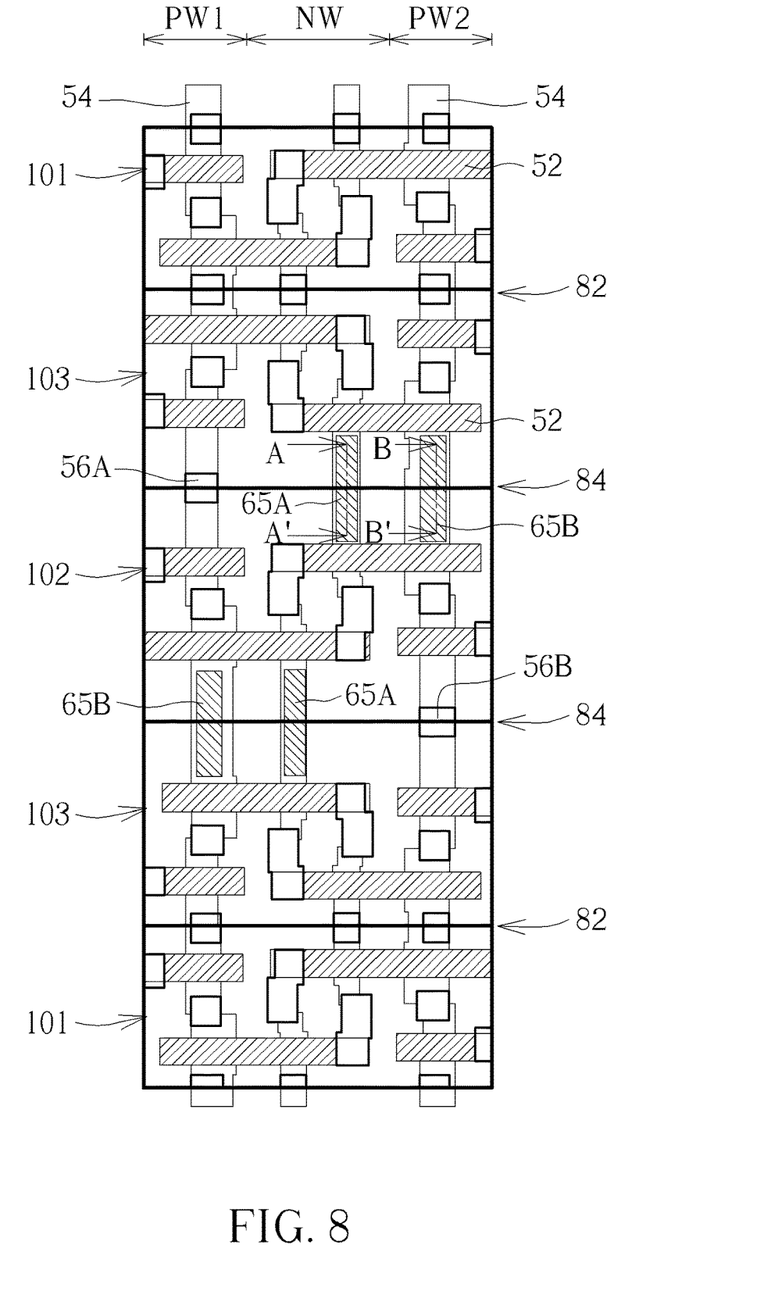
FIG. 8 shows another embodiment of the present invention.
Figure 8A:
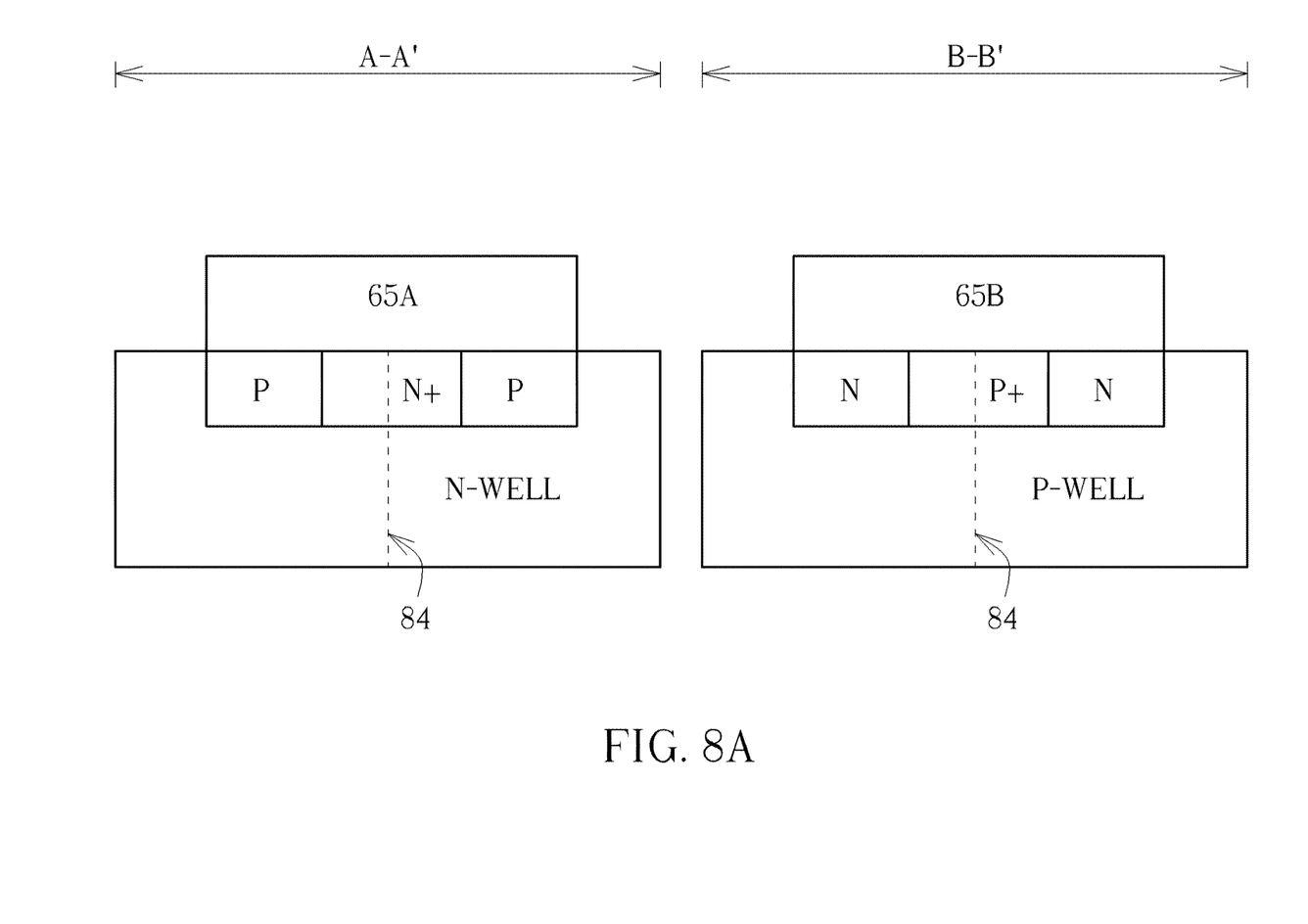
FIG. 8A shows the cross section diagrams according to the cross section lines A-A' and B-B' in FIG. 8.
Figure 9:
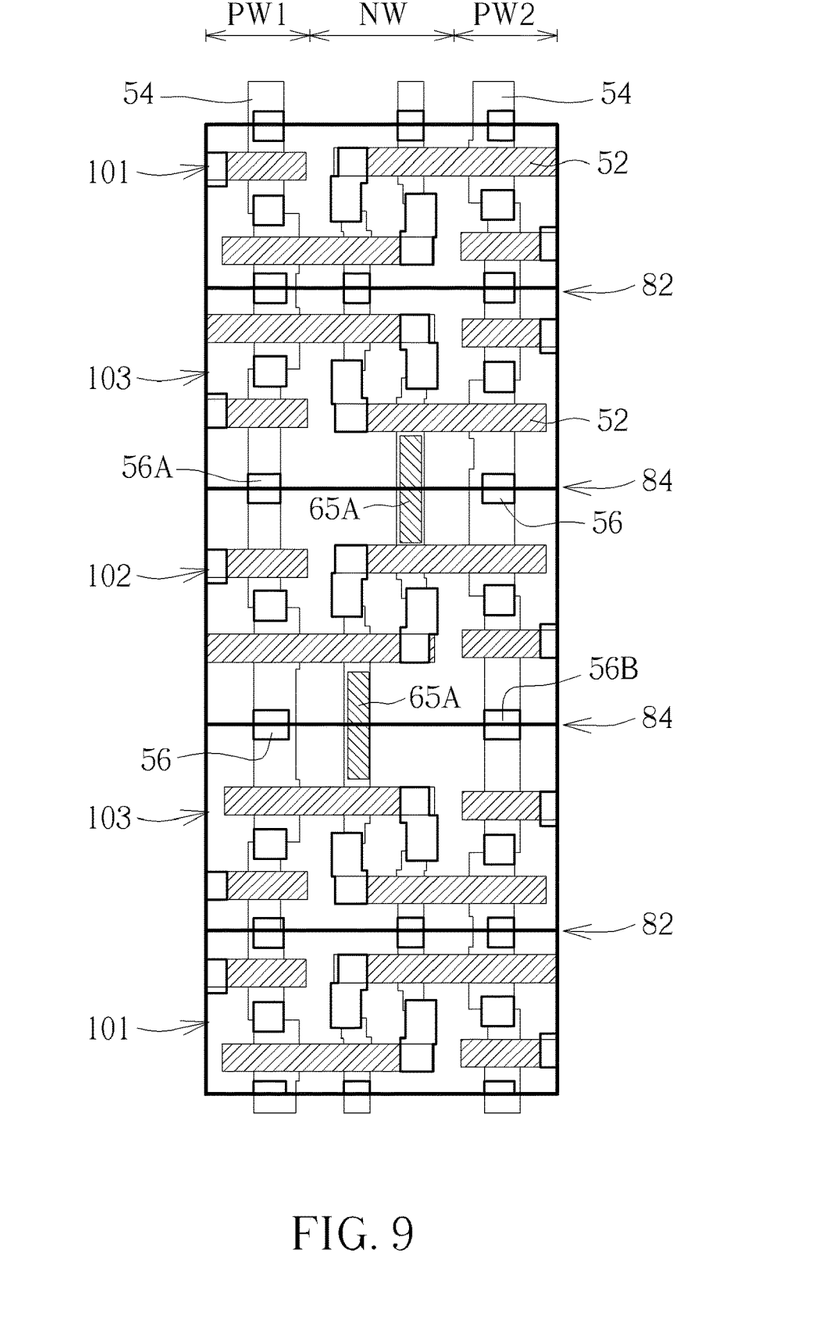
FIG. 9 shows another embodiment of the present invention.

FIGS. 8-9 show two other embodiments of the present invention. To simplify the description, the following description will detail the dissimilarities among the different embodiments and the identical features will not be redundantly described. In order to compare the differences between the embodiments easily, the identical components in each of the following embodiments are marked with identical symbols. As shown in FIG. 8, the main feature of the embodiment is the first voltage providing contacts 62A, 62B and the second voltage providing contacts 64A, 64B at the second boundary line 84 are formed to become slot contacts 65A, 65B. Each slot contact 65A or 65B is connected to parts of the contact structures 56 (please also refer to FIG. 4). Therefore, the area near the second boundary line 84 can be further shrunk, and the total area of the memory device can be decreased. FIG. 8A shows the cross section diagrams according to the cross section lines A-A' and B-B' in FIG. 8. The doped regions under the slot contacts 65A, 65B are shown. Take the slot contact 65A as an example, an N-type (N+) doped region and two P-type doped regions are formed, and the N-type (N+) doped region directly contacts the two P-type doped regions. In another case, as shown in FIG. 9, this embodiment only comprises the slot contact 65A used for providing the voltage to the N-type well region NW, but the slot contact 65B used for providing the voltage to the first P-type well region PW1 and the second P-type well region PW2 are omitted. In other words, the voltage difference between the N-type well region NW and the P-type well region (including the first P-type well region PW1 and the second P-type well region PW2) is controlled by only the slot contact 65A. It should also be within the scope of the present invention.

A key feature of the present invention is having long stripe-shaped P-type well regions and N-type well regions, and all memory cells being disposed within and arranged along the P-type well regions or the N-type well regions, which allows the manufacturing processes to be simplified. In addition, each memory cell in the first region responsible for the main data storage function, and the needed voltages contacts of the memory cells (including the Vcc, Vss, or the voltages providing to the P-type well regions and N-type well regions) are not disposed within the first region, but only disposed within the second region or the third region, so the area of each first region can be reduced. Furthermore, since the second regions and the third regions also include the memory cell, so if necessary, the second region and the third region may also be used as spare storage data elements.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
a first P-type well region, extending along a first direction;
a second P-type well region, extending along the first direction;
an N-type well region, extending along the first direction, and disposed between the first P-type well region and the second P-type well region;
wherein with respect to a plan view of a principal plane of the semiconductor memory device, the following conditions are satisfied:
(1) the semiconductor memory device defines a plurality of first regions, each first region being arranged along the first direction;
(2) the semiconductor memory device defines at least one second region, the second region disposed between two adjacent first regions, the second region and each first region not being overlapped with each other;
(3) each second region further comprises at least two first voltage providing contacts, providing a first voltage to the first P-type well region and the second P-type well region, and a second voltage providing contact, providing a second voltage to the N-type well region, wherein the first voltage providing contacts and the second voltage providing contact are not located within each first region; and
(4) each first region and each second region comprise a memory cell disposed therein, each memory cell comprises a plurality of N-channel MOS (NMOS) transistors and a plurality of P-channel MOS (PMOS) transistors, each PMOS transistor being disposed within the N-type well region, and each NMOS transistor being disposed within the first P-type well region or the second P-type well region.

2. The semiconductor memory device of claim 1, further comprising:
a first bit line, a second bit line and a plurality of word lines, each memory cell having a first inverter including a first NMOS transistor and a first PMOS transistor;
a second inverter including a second NMOS transistor and a second PMOS transistor, the first inverter and the second inverter being coupled to each other;
a third NMOS transistor having a source and a drain, coupled to an output terminal of the first inverter and the first bit line respectively; and
a fourth NMOS transistor having a source and a drain, coupled to an output terminal of said second inverter and the second bit line respectively, wherein a gate of the third NMOS and a gate of the fourth NMOS are connected to one of the plurality of word lines.

3. The semiconductor memory device of claim 2, wherein the first PMOS transistor and the second PMOS transistor of each memory cell are disposed within the N-type well region, the first NMOS transistor and the third NMOS transistor of each memory cell are disposed within the first P-type well region, and the second NMOS transistor and the fourth NMOS transistor of each memory cell are disposed within the second P-type well region.

4. The semiconductor memory device of claim 2, wherein the first region further comprises:
a first contact structure, electrically connected to the third NMOS transistor and the first bit line;
a second contact structure, electrically connected to the fourth NMOS transistor and the second bit line;

a third contact structure, electrically connected to one of the plurality word lines and the gate of the third NMOS transistor; and a fourth contact structure, electrically connected to one of the plurality word lines and the gate of the fourth NMOS transistor.

5. The semiconductor memory device of claim 1, wherein the first region does not comprise any contact structure used for providing the first voltage to the first P-type well region.

6. The semiconductor memory device of claim 1, wherein the first region does not comprise any contact structure used for providing the first voltage to the second P-type well region.

7. The semiconductor memory device of claim 1, wherein the first region does not comprise any contact structure used for providing the second voltage to the N-type well region.

8. The semiconductor memory device of claim 1, further comprising a third region, disposed between the first region and the second region, each third region comprising one of said memory cells, the third region not overlapping with the first region and the second region.

9. The semiconductor memory device of claim 8, wherein the first region, the second region and the third region are arranged along the first direction.

10. The semiconductor memory device of claim 8, wherein when viewed in the plane view, each third region is disposed adjacent to at least one first region, a first boundary line is defined at the interface between the third region and the first region, and the first boundary line is not overlapped with the first voltage providing contacts and the second voltage providing contact.

11. The semiconductor memory device of claim 8, wherein when viewed in the plane view, each third region is disposed adjacent to at least one second region, a second boundary line is defined at the interface between the third region and the second region, and the second boundary line is overlapped with the first voltage providing contacts and the second voltage providing contact.

12. The semiconductor memory device of claim 8, further comprising a plurality of memory arrays, each memory array comprising the plurality of said memory cells arranged along the first direction.

13. The semiconductor memory device of claim 8, wherein each memory array comprises:

M first memory groups, each first memory group comprising N first regions, wherein $N=2^n$, n being an integer greater than 1; and two third regions and at least one second region, disposed between two adjacent first regions, wherein the second region is disposed between the two third regions.

14. A semiconductor memory device, comprising:

a first P-type well region, extending along a first direction;

a second P-type well region, extending along the first direction;

an N-type well region, extending along the first direction, and disposed between the first P-type well region and the second P-type well region;

wherein with respect to a plan view of a principal plane of the semiconductor memory device, the following conditions are satisfied:

(1) the semiconductor memory device defines a plurality of first regions, each first region being arranged along the first direction;

(2) the semiconductor memory device defines at least one second region, the second region disposed between two adjacent first regions, the second region and each first region not being overlapped with each other;

(3) each second region further comprises at least one second voltage providing contact, providing a second voltage to the N-type well region, wherein the second voltage providing contact are not located within each first region; and (4) each first region and each second region comprise a memory cell disposed therein, each memory cell comprises a plurality of N-channel MOS (NMOS) transistors and a plurality of P-channel MOS (PMOS) transistors, each PMOS transistor being disposed within the N-type well region, and each NMOS transistor being disposed within the first P-type well region or the second P-type well region.

15. The semiconductor memory device of claim 14, further comprising at least one slot contact, disposed in the semiconductor memory device.

16. The semiconductor memory device of claim 15, further comprising two first doped regions and a second doped region disposed in a substrate under the slot contact, the second doped region directly contacting the two first doped regions, and the second doped region and each first doped region having complementary conductivity type.

* * * * *